US008487305B2

(12) United States Patent
Iguchi et al.

(10) Patent No.: US 8,487,305 B2
(45) Date of Patent: Jul. 16, 2013

(54) SEMICONDUCTOR DEVICE AND METHOD OF MANUFACTURING THE SAME

(75) Inventors: Manabu Iguchi, Kanagawa (JP); Mami Miyasaka, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/414,397

(22) Filed: Mar. 7, 2012

(65) Prior Publication Data

US 2012/0161335 A1    Jun. 28, 2012

Related U.S. Application Data

(62) Division of application No. 12/458,224, filed on Jul. 6, 2009, now Pat. No. 8,158,446.

(30) Foreign Application Priority Data

Jul. 7, 2008    (JP) .................................. 2008-176521

(51) Int. Cl.
*H01L 23/528*    (2006.01)
*H01L 23/544*    (2006.01)
*H01L 23/58*    (2006.01)
*H01L 23/522*    (2006.01)
*H01L 21/66*    (2006.01)

(52) U.S. Cl.
CPC ............ *H01L 23/5226* (2013.01); *H01L 22/32* (2013.01)
USPC   257/48; 257/797; 257/E23.179; 257/E23.168

(58) Field of Classification Search
CPC ............................. H01L 22/32; H01L 23/5226
USPC ...................... 257/48, 797, E23.179, E23.168
See application file for complete search history.

(56) References Cited

U.S. PATENT DOCUMENTS

| | | | |
|---|---|---|---|
| 6,200,882 B1 | 3/2001 | Drake et al. | |
| 7,772,091 B2 | 8/2010 | Machida | |
| 7,799,673 B2 * | 9/2010 | Arai et al. | 438/623 |
| 7,977,232 B2 * | 7/2011 | Eto | 438/622 |
| 8,158,446 B2 * | 4/2012 | Iguchi et al. | 438/7 |
| 2004/0137700 A1 | 7/2004 | Sekiya | |
| 2008/0160714 A1 * | 7/2008 | Shim et al. | 438/401 |
| 2009/0075457 A1 | 3/2009 | Machida | |
| 2011/0241177 A1 * | 10/2011 | Eto | 257/620 |

FOREIGN PATENT DOCUMENTS

| | | |
|---|---|---|
| JP | 2001-160591 A | 6/2001 |
| JP | 2006-108571 A | 4/2006 |

\* cited by examiner

*Primary Examiner* — Evan Pert
(74) *Attorney, Agent, or Firm* — McGinn IP Law Group, PLLC

(57) ABSTRACT

A semiconductor device includes a semiconductor substrate, and an insulating layer that is provided on the semiconductor substrate, wherein, in an internal circuit formation region of the insulating layer, a via hole and an interconnect trench, that is formed on the via hole and communicates with the via hole, are provided, in the via hole and the interconnect trench, a conductor is provided so as to integrally fill the via hole and said interconnect trench, in a dicing region of the insulating layer, a groove portion and an opening, that communicates with the groove portion and is formed to cover the groove portion when the semiconductor substrate is seen in plane view, are formed, and in the groove portion and the opening, a conductor is provided so as to integrally fill the groove portion and the opening.

7 Claims, 7 Drawing Sheets

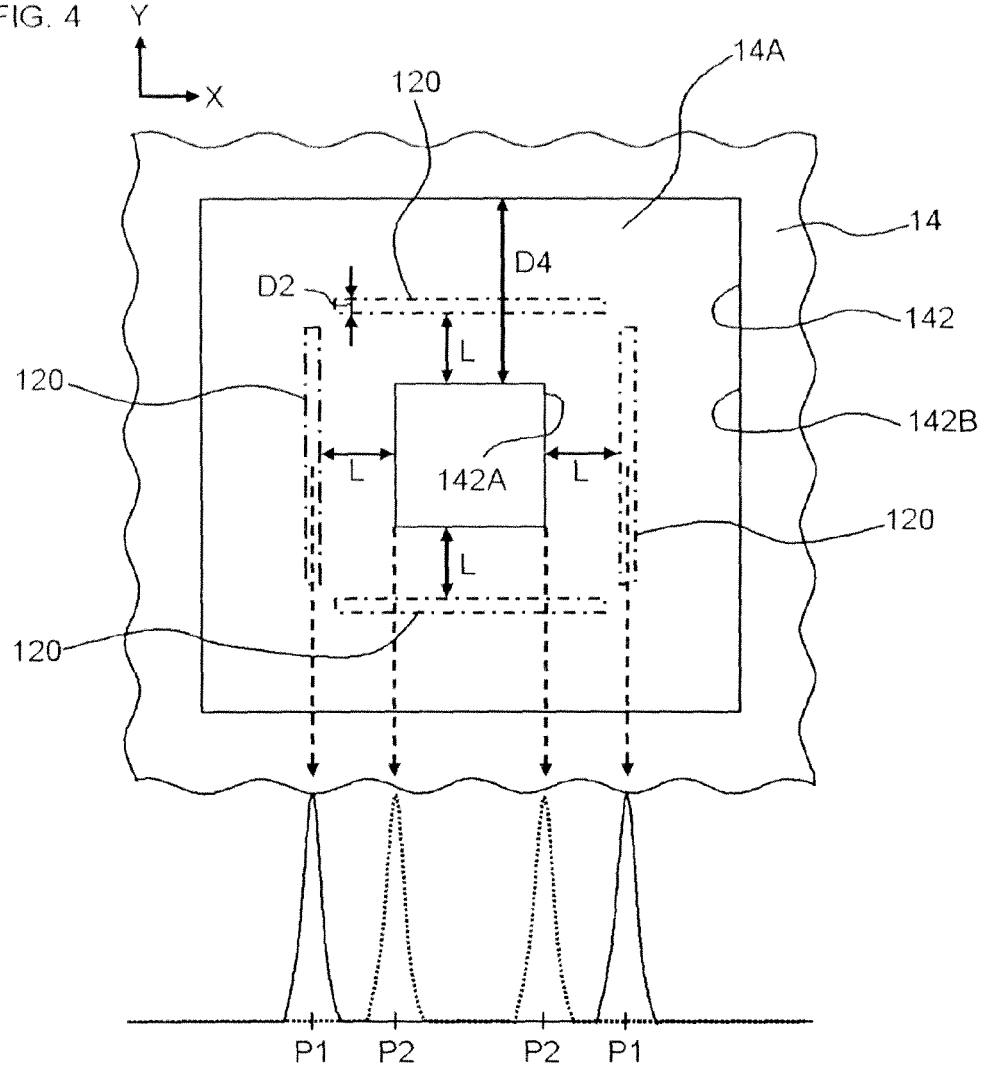

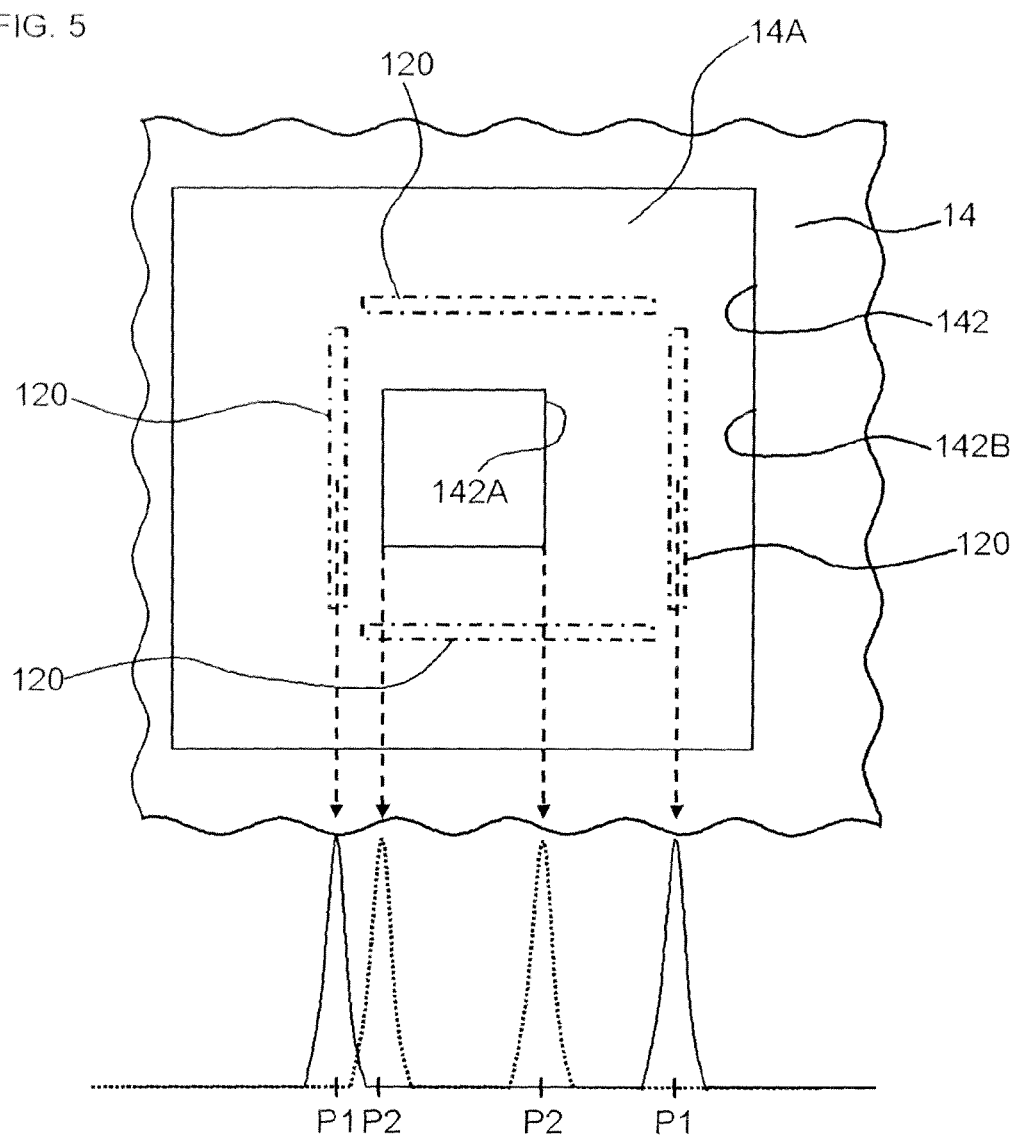

SEMICONDUCTOR DEVICE AND METHOD OF MANUFACTURING THE SAME

The present application is a Divisional Application of U.S. patent application Ser. No. 12/458,224 filed on Jul. 6, 2009, now U.S. Pat. No. 8,158,446, which is based on Japanese patent application No. 2008-176521, filed on Jul. 7, 2008, the entire contents of which is incorporated herein by reference.

BACKGROUND OF THE INVENTION

1. Technical Field

The present invention relates to a semiconductor device and a method of manufacturing the semiconductor device.

2. Related Art

In recent years, with the high integration of a semiconductor integrated circuit, a semiconductor device that has a multilayered interconnect structure has been developed. In the semiconductor device that has the multilayered interconnect structure, a via is formed in order to connect interconnects formed in different wiring layers.

In recent years, when the semiconductor device is manufactured, a so-called dual damascene method has been widely used, in which an interconnect and a via are simultaneously formed.

Specifically, as shown in FIG. 6A, after forming an interconnect 802 in a lower insulating layer 801, an insulating interlayer 803 is formed, and a via hole 803A is formed in the insulating interlayer 803. Then, as shown in FIG. 6B, a first resist film 804 is formed on the insulating interlayer 803. Then, as shown in FIG. 6C, a second resist film 805 where an opening 805A according to the upper interconnect trench is formed is provided on the first resist film 804.

The first resist film 804 and the insulating interlayer 803 are etched in accordance with the opening 805A, and an interconnect trench 803D is formed. The interconnect trench 803D communicates with the via hole 803A.

The first resist film 804 and the second resist film 805 are removed by etching in the course of forming the interconnect trench 803D.

Next, a bottom portion of the via hole 803A of the interlayer insulting film 803 is removed. Next, as shown in FIG. 6D, the via hole 803A and the interconnect trench 803D are filled with a conductor to simultaneously form an upper interconnect 806 and a via 807.

In this manufacturing method, a deviation between the via hole 807 and the upper interconnect 806, that is, a positional deviation between the upper interconnect trench 803D and the via hole 803A becomes a problem.

Accordingly, as shown in FIGS. 7A and 7B, separately from the via hole 803A, a position aligning groove 803B is formed in the insulating interlayer 803, and a position aligning opening 805B is formed in the second resist film 805 to form the interconnect trench 803D.

A positional relationship between the position aligning groove 803B of the insulating interlayer 803 and the via hole 803A and a positional relationship between a position aligning opening 805B of the second resist film 805 and an opening 805A according to a pattern of the interconnect trench are previously grasped.

For this reason, if a positional relationship between the position aligning groove 803B of the insulating interlayer 803 and the position aligning opening 805B of the second resist film 805 is grasped, it is possible to detect whether the via hole 803A and the opening 805A according to a pattern of the interconnect trench 803D exist at predetermined positions.

As a result, it is possible to prevent a deviation between a via 807 and an upper interconnect 806.

[Patent Document 1] Japanese Patent Application Laid-Open (JP-A) No. 2006-108571
[Patent Document 2] Japanese Patent Application Laid-Open No. 2001-160591

The present inventors have recognized as follows. In Japanese Patent Application Laid-Open (JP-A) No. 2006-108571, there are following problems.

As shown in FIG. 7B, in the manufacturing method according to the related art, after the second resist film 805 and the first resist film 804 are removed, the first resist film 804 may remain in the position aligning groove 803B.

As such, the remaining first resist film 804 causes a particle to be generated and causes manufacturing efficiency of the semiconductor device to be deteriorated.

Further, reference numeral 803C in FIG. 7B denotes an opening that is formed in accordance with the position aligning opening 805B of the second resist film 805.

SUMMARY

In one embodiment, there is provided a method of manufacturing a semiconductor device including: providing an insulating layer on a semiconductor substrate; forming a groove portion in a dicing region of the insulating layer and forming a via hole in an internal circuit formation region of the insulating layer; providing a first resist film on the insulating layer; providing a second resist film to cover the first resist film; selectively removing the second resist film, forming an interconnect opening according to an interconnect trench in a region covering an internal circuit formation region of the second resist film, and forming a position aligning opening in a region covering the dicing region of the second resist film; detecting a positional relationship between the groove portion formed in the insulating layer and the position aligning opening of the second resist film so as to detect whether the interconnect opening of the second resist film exists at a predetermined position with respect to the via hole of the insulating layer; and when it is detected that the interconnect opening of the second resist film exists at the predetermined position, selectively removing the first resist film and the insulating layer in accordance with the interconnect opening of the second resist film and the position aligning opening, and forming an interconnect trench according to the interconnect opening of the second resist film and an opening according to the position aligning opening of the second resist film in the insulating layer. In the selectively removing of the second resist film, when the semiconductor substrate is seen in plan view, a region of the position aligning opening is formed to cover the groove portion.

In this invention, the position aligning opening that is formed in the second resist film covers the groove portion that is formed in the insulating layer. As a result, the first resist film is selectively removed on the groove portion, and the opening that communicates with the groove portion is formed in the insulating layer. Therefore, in the forming of the opening, the first resist that is filled into the groove portion is easily removed from the groove portion.

As a result, the generation of the particle can be prevented and the manufacturing efficiency of the semiconductor device can be improved.

Further, in another embodiment, there is provided a semiconductor device that is manufactured using the above-described manufacturing method. Specifically, the semiconductor device includes a semiconductor substrate and an insulating layer that is provided on the semiconductor substrate. In an internal circuit formation region of the insulating layer, a via hole and an interconnect trench, that is formed on the via hole and communicates with the via hole, are provided. In the via hole and the interconnect trench, a conductor is provided to integrally fill the via hole and the interconnect trench. In a dicing region of the insulating layer, a groove portion, and an opening that communicates with the groove portion and is formed to cover the groove portion when the semiconductor substrate is seen in plan view, are formed. In the groove portion and the opening, a conductor is provided to integrally fill the groove portion and the opening.

This semiconductor device has excellent manufacture stability.

According to the present invention, it is possible to provide a semiconductor device and a method of manufacturing the same that can improve manufacturing efficiency of the semiconductor device.

BRIEF DESCRIPTION OF THE DRAWINGS

The above and other objects, advantages and features of the patent invention will be more apparent from the following description of certain preferred embodiments taken in conjunction with the accompanying drawings, in which:

FIGS. 4 and 5 are diagrams illustrating a positional relationship between a position aligning opening and a groove;

DETAILED DESCRIPTION

Figure 1A:
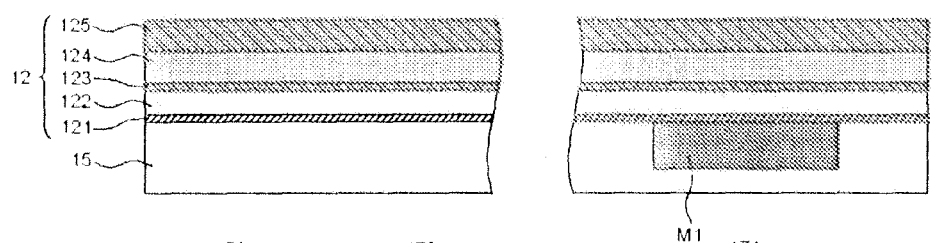
FIGS. 1A and 1B are cross-sectional views illustrating a process of manufacturing a semiconductor device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereinafter, an embodiment of the present invention will be described with reference to FIGS. 1A to 5.

First, a method of manufacturing a semiconductor device 1 according to this embodiment will be schematically described.

In FIGS. 1A to 3B, processes of manufacturing the semiconductor device 1 according to this embodiment are shown.

The method of manufacturing the semiconductor device 1 according to this embodiment includes: providing an insulating layer 12 on a semiconductor substrate (not shown); forming a groove portion 120 in a dicing region of the insulating layer 12 and forming a via hole 126 in an internal circuit formation region of the insulating layer 12; providing a first resist film 13 on the insulating layer 12; providing a second resist film 14 to cover the first resist film 13; selectively removing the second resist film 14, forming an interconnect opening 141 according to an interconnect trench in a region covering an internal circuit formation region of the second resist film 14, and forming a position aligning opening 142 in a region covering the dicing region of the second resist film 14; detecting a positional relationship between the groove portion 120 formed in the insulating layer 12 and the position aligning opening 142 of the second resist film 14 so as to detect whether the interconnect opening 141 of the second resist film 14 exists at a predetermined position with respect to the via hole 126 of the insulating layer 12; and when it is detected that the interconnect opening 141 of the second resist film 14 exists at the predetermined position, selectively removing the first resist film 13 and the insulating layer 12 in accordance with the interconnect opening 141 of the second resist film 14 and the position aligning opening 142.

When it is detected that the interconnect opening 141 of the second resist film 14 does not exist at the predetermined position, the second resist film 14 is removed.

In selectively removing the second resist film 14, when the semiconductor substrate is seen in plan view, the position aligning opening 142 is formed to cover the groove portion 120 of the insulating layer 12.

Next, the processes of manufacturing the semiconductor device 1 according to this embodiment will be described in detail.

In the individual process cross-sectional views, a right side shows an internal circuit formation region and a left side shows a dicing region.

First, as shown in FIG. 1A, an insulating layer 15 is formed on a semiconductor substrate (not shown) and a lower interconnect M1 is formed in the insulating layer 15. The lower interconnect M1 has a width of about 1 μm.

Next, the insulating layer 12 is provided on the insulating layer 15 where the lower interconnect M1 is formed.

In the insulating layer 12, an etching stopper 121, a first low dielectric constant film 122, a $SiO_2$ film 123, a second low dielectric constant film 124, and a $SiO_2$ film 125 are sequentially laminated from the side of the insulating layer 15.

The etching stopper 121 is composed of, for example, an SiCN film, and each of the first low dielectric constant film 122 and the second low dielectric constant film 124 is composed of, for example, a Low-K film.

Figure 1B:
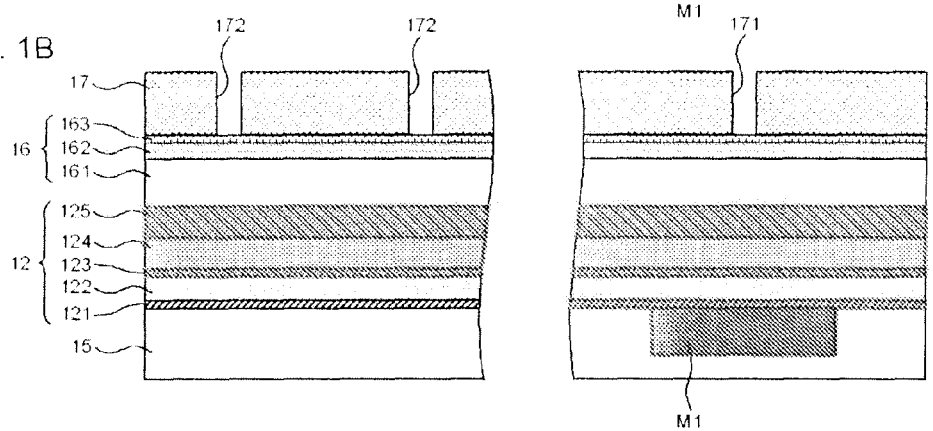

Next, as shown in FIG. 1B, a resist film 16 is formed on the insulating layer 12. In the resist film 16, an organic film 161, a low-temperature $SiO_2$ film 162, and a reflection barrier 163 are sequentially laminated from the side of the insulating layer 12. The organic film 161 is used in i-line exposure, and is a resist film that has excellent dry etching resistance.

Then, a resist film 17 is applied to the resist film 16.

The resist film 17 is a photosensitive organic film.

A predetermined region of the resist film 17 is irradiated with a light and the resist film 17 is exposed and developed, thereby selectively removing the resist film 17. As a result, an opening 171 for the via hole 126 and an opening 172 for the groove portion 120 are formed in the resist film 17.

First, the resist film 16 is etched using the resist film 17 as a mask. As a result, an opening for the via hole 126 and an opening for the groove portion 120 are formed in the resist film 16. Next, the insulating layer 12 is etched using the resist film 16 as a mask.

Figure 2A:
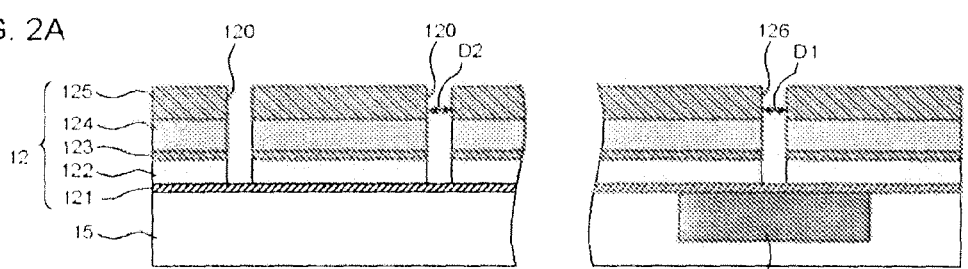
FIGS. 2A and 2B are cross-sectional views illustrating a process of manufacturing a semiconductor device.

By doing so, the via hole 126 and the groove portion 120 are formed in the insulating layer 12 (refer to FIG. 2A).

Further, the resist films 16 and 17 are gradually removed when the via hole 126 and the groove portion 120 are etched, in the course of forming the via hole 126 and the groove portion 120.

In this case, a diameter D1 of the via hole 126 that is formed in the insulating layer 12 is, for example, 0.1 μm. The groove portion 120 is formed in a slit shape, and a width D2 (width along the light scanning direction which will be described in detail below) the groove portion 120 in a short-side direction is not less than 0.2 m and not more than 5 □m. The width D2 of the groove portion 120 in the short-side direction is larger than the diameter D1 of the via hole 126.

Further, a plurality of groove portions 120 are formed. For example, four grove portions are formed, as shown in FIG. 4. Among the four groove portions 120, a pair of groove portions 120 are disposed to be opposite to each other, and another pair of groove portions 120 are disposed to be opposite to each other. That is, the respective grooves 120 are disposed to constitute sides of square.

Figure 2B:
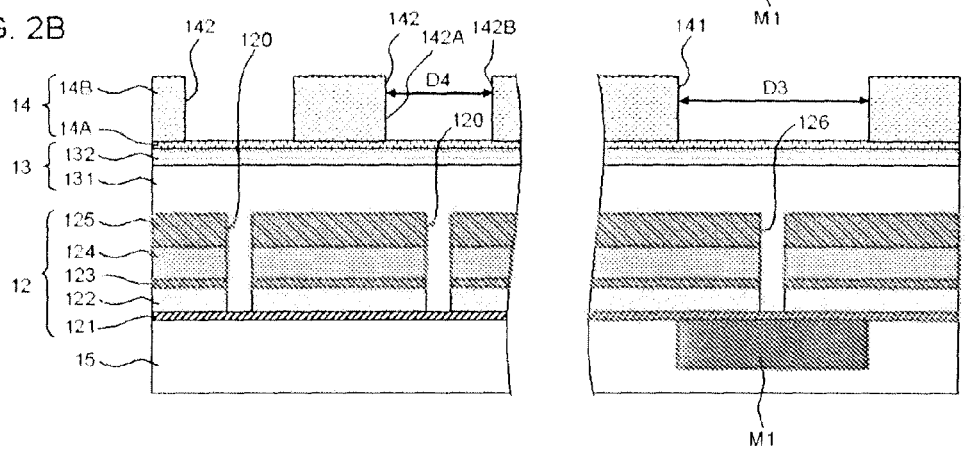

Next, as shown in FIG. 2B, a resist film 13 (first resist film) is formed on the insulating layer 12.

In the resist film 13, an organic film 131 and a low-temperature $SiO_2$ film 132 (ashing-resistant film) are laminated from the side of the insulating layer 12. In the resist film 13, the organic film 131 is provided to fill the via hole 126 and the groove portion 120.

As the organic film 131, an organic film that has the same configuration as the organic film 161 may be used.

Next, a resist film 14 (second resist film) is formed on the resist film 13. The resist film 14 has a reflection barrier 14A and a photosensitive organic film 14B that is laminated on the reflection barrier 14A.

A predetermined region of the resist film 14 is irradiated with a light and the resist film 14 is developed and exposed, thereby selectively removing the resist film 14. Thereby, the interconnect opening 141 and the position aligning opening 142 are formed in the resist film 14. In this case, the interconnect opening 141 and the position aligning opening 142 are formed in the organic film 14B. The interconnect opening 141 has a width D3 of about 1 μm.

As shown in FIG. 4, the position aligning opening 142 is formed in a rectangular frame shape, when the semiconductor substrate is seen in plan view from the side of a substrate surface.

The individual sides constituting a rectangular frame shape that forms a region of the position aligning opening 142 coat the respective grooves 120 that are formed in the insulating layer 12. The individual sides completely cover the entire surface of the groove portions 120, when the semiconductor substrate is seen in plan view from the side of a substrate surface.

Further, a sidewall of the position aligning opening 142 is away from the sidewall of the groove portion 120, when the semiconductor substrate is seen in plan view from the side of a substrate surface.

Specifically, a distance L between the sidewall of each side of the position aligning opening 142 in a short-side direction and the sidewall of the groove 120 in a short-side direction, which is adjacent to the sidewall and covered by each side of the position aligning opening 142, is preferably not less than 3 μm.

Further, as shown in FIG. 2B, a width D4 of each side of the position aligning opening 142 in a short-side direction (width of a region that is formed along a light scanning direction and covers the groove portion 120) is preferably seven times larger than the width D2 of the groove portion 120 in a short-side direction as a minimum value and one hundred times larger than the width D2 as a maximum value. For example, the width D4 of each side of the position aligning opening 142 in a short-side direction is not less than 7 μm and not more than 20 μm.

Then, a positional relationship between the groove portion 120 formed in the insulating layer 12 and the position aligning opening 142 of the resist film 14 is detected, and it is detected whether the interconnect opening 141 of the resist film 14 exists at a predetermined position with respect to the via hole 126 of the insulating layer 12.

The position of the groove portion 120 of the insulating layer 12 and the position of the via hole 126 are previously grasped. In the same way, the position of the interconnect opening 141 of the resist film 14 and the position of the position aligning opening 142 are previously grasped.

Accordingly, a positional relationship between the groove portion 120 and the position aligning opening 142 is detected, and it is grasped whether the positional relationship between the groove portion 120 and the position aligning opening 142 follows the predetermined positional relationship, thereby grasping whether the interconnect opening 141 of the resist film 14 exists at the predetermined position with respect to the via hole 126 of the insulating layer 12.

Here, a method that detects the positional relationship between the groove portion 120 and the position aligning opening 142 will be described.

From the side of the substrate surface of the semiconductor substrate, light around a visible light region, for example, light having a wavelength of not less than 400 nm and not more than 700 nm is applied to the semiconductor substrate where the resist film 14 is laminated.

At this time, the light is scanned such that a scanning direction is along the surface of the semiconductor substrate and orthogonal to a longitudinal direction of the groove portion 120 and a longitudinal direction of each side of the position aligning opening 142. In addition, the light reflected or diffracted by the groove portion 120 and the position aligning opening 142 is detected. As shown in FIG. 4, a peak position P1 of a signal of the light from the groove portion 120 and a peak position P2 of a signal of the light from the sidewall constituting the position aligning opening 142 are detected, and a distance between the peak positions P1 and P2 is acquired. In this case, a peak position of a signal of the light from the sidewall 142A that is located inside of a rectangular frame among the sidewalls constituting the position aligning opening 142 is detected.

It is grasped whether the position aligning opening 142 and the groove portion 120 follow the predetermined positional relationship, based on the distance between the peak positions P1 and P2.

For example, as shown in FIG. 5, when an interval between the peak position P of the signal of the light from the groove portion 120 and the peak position P2 of the signal of the light from the sidewall of the position aligning opening 142 is not the predetermined interval, a deviation between the position aligning opening 142 and the groove portion 120 is detected from a deviation between the peak positions P1 and P2.

Thereafter, the resist film 14 is removed and a new resist film 14 is formed.

Next, the positions of the mask of the exposure device and the resist film 14 are adjusted based on the detected deviation amount, and the resist film 14 is exposed and developed again. As result, the interconnect opening 141 and the position aligning opening 142 are formed at the positions based on the deviation amount.

Thereafter, the positional relationship between the groove portion 120 and the position aligning opening 142 is detected again, and the above-described processes are repeated until the positional relationship between the groove portion 120 and the position aligning opening 142 becomes the predetermined positional relationship.

Figure 3A:
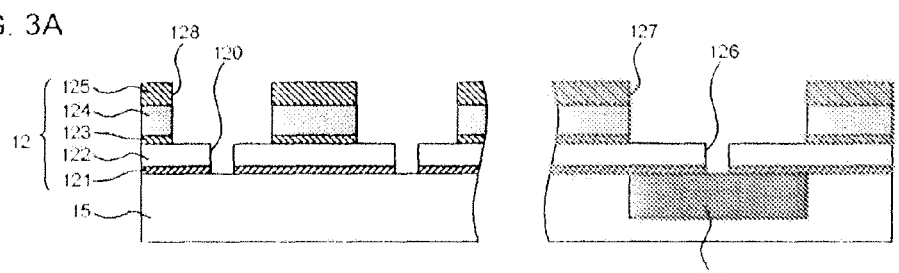
FIGS. 3A and 3B are cross-sectional views illustrating a semiconductor device.

When the positional relationship between the groove portion 120 and the position aligning opening 142 becomes the predetermined positional relationship, the resist film 13 is etched using the resist film 14 as a mask. In the resist film 13, an opening according to the position aligning opening 142 and a pattern according to the interconnect opening 141 are formed. Thereafter, the insulating layer 12 is etched using the resist film 13 as a mask. As a result, as shown in FIG. 3A, an interconnect trench 127 that communicates with the via hole 126 is formed in the internal circuit formation region of the insulating layer 12.

Meanwhile, in the dicing region of the insulating layer 12, an opening 128 that communicates with the groove portion 120 is formed on the groove portion 120.

The region of the opening 128 completely covers the grove portion 120, and the opening 128 has a shape according to the position aligning opening 142. That is, a width of the region that covers the groove portion 120 of the opening 128 is larger than the width of the groove portion 120, and the opening 128 has a rectangular frame shape in plan view.

Further, in the course of etching the resist film 13, the resist film 14 is removed. Further, in the course of etching the insulating layer 12, the resist film 13 is removed.

At this time, since the opening 128 is provided on the groove portion 120, the organic film 131 that is filled into the groove portion 120 is removed from the groove portion 120, in the course of forming the opening 128 and the interconnect trench 127.

Further, when the etching of the insulating layer 12 is completed, the etching stopper 121 remains on the groove portion 120 and the bottom portion of the via hole 126. The etching stopper 121 is removed by etch-back of dry etching.

Figure 3B:
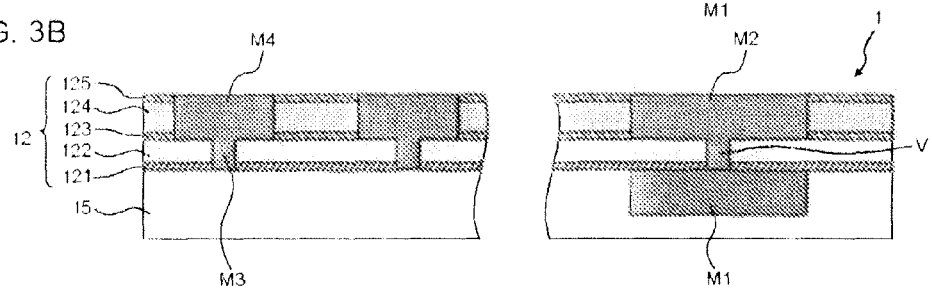
Figure 6A:
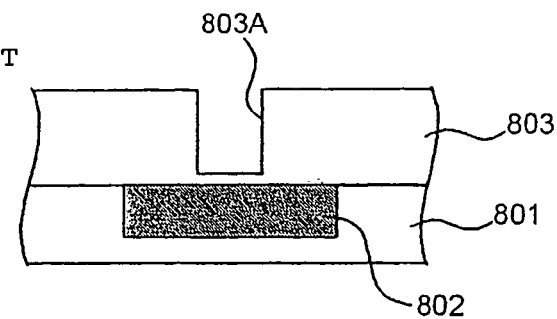
FIGS. 6A to 6D are cross-sectional views illustrating a process of manufacturing a semiconductor device according to the related art.
Figure 6B:
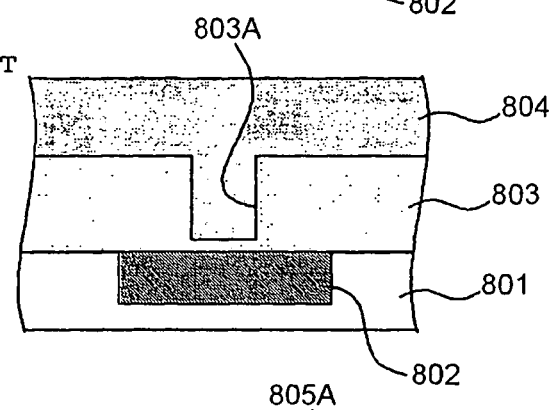
Figure 6C:
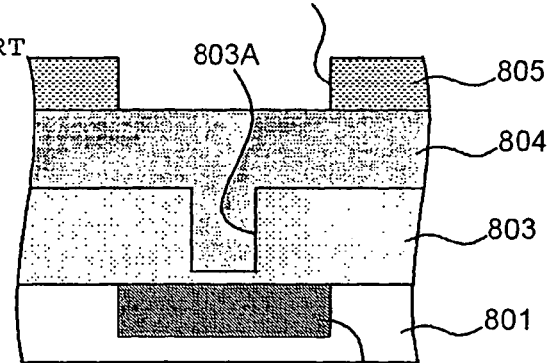
Figure 6D:
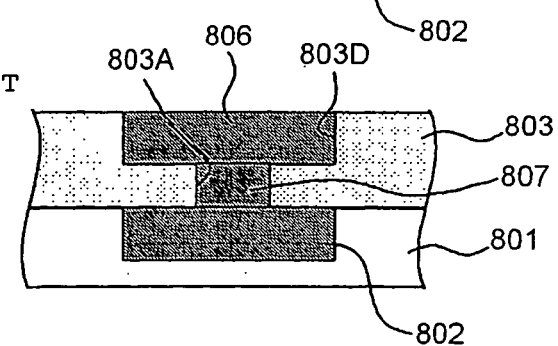
Figure 7A:
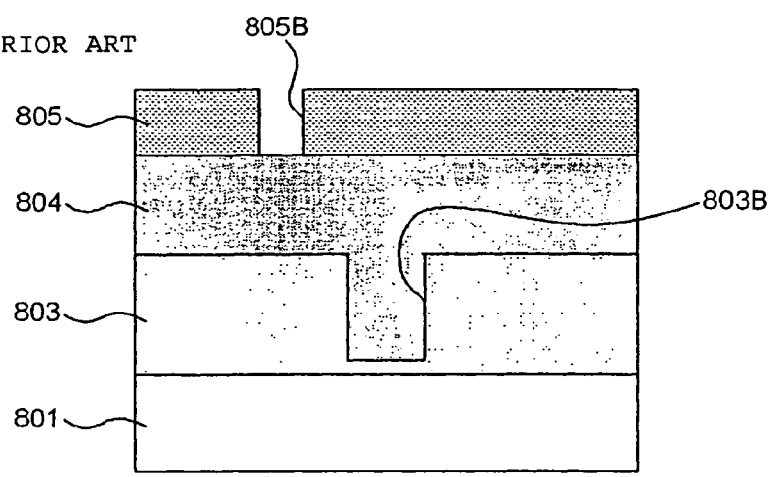
FIGS. 7A and 7B are cross-sectional views illustrating a process of manufacturing a semiconductor device according to the related art.
Figure 7B:
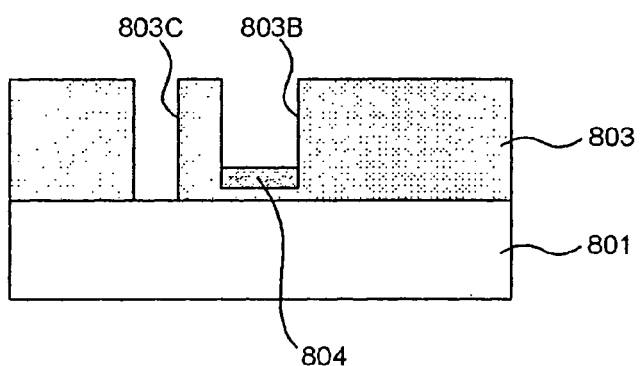

Thereafter, as shown in FIG. 3B, a conductor, such as a metal, is buried in the via hole 126, the interconnect trench 127, and the opening 128. In this case, a dual damascene method is used.

As a result, an upper interconnect M2, a via V, a first conductor M3, and a second conductor M4 are formed.

The semiconductor device 1 thus obtained has the first conductor M3 and the second conductor M4 provided to coat the first conductor M3, in the dicing region.

That is, the semiconductor device 1 has the semiconductor substrate and the insulating layer 12 that is provided on the semiconductor substrate. In the internal circuit formation region of the insulating layer 12, the via hole 126 and the interconnect trench 127 that is formed on the via hole 126 and communicates with the via hole 126 are provided. In the via hole 126 and the interconnect trench 127, the conductors V and M2 are provided to integrally fill the via hole 126 and the interconnect trench 127. In the dicing region of the insulating layer 12, the groove 120 and the opening 128 that communicates with the groove portion 120 and is provided to cover the groove portion 120 when the semiconductor substrate is seen in plan view from the side of a substrate surface are formed. In the groove 120 and the opening 128, the conductors M3 and M4 are provided to integrally fill the groove portion 120 and the opening 128. In this way, the semiconductor device is obtained.

The semiconductor device 1 has excellent manufacture stability.

Next, functions and effects of this embodiment will be described.

In the manufacturing method according to the related art, in the portion of the second resist film 805 that is located on the upper portion of the position aligning groove 803B of the insulating interlayer 803, an opening is not formed. Accordingly, in the upper portion of the position aligning groove 803B, a thick resist that includes the first resist 804 and the second resist 805 exists. The first resist film 804 and the second resist film 805 are removed in the course of forming the opening 803C. However, since it is difficult to remove the resist films 804 and 805 on the position aligning groove 803B, it is likely for the first resist 804 to remain in the position aligning groove 803B.

Meanwhile, in this embodiment of the present invention, the region of the position aligning opening 142 that is formed in the resist film 14 covers the groove portion 120 that is formed in the insulating layer 12. Accordingly, the thickness of the resist film on the groove portion 120 is smaller than that in the related art. For this reason, it is likely for the resist film 13 to be removed in the upper portion of the groove portion 120.

Further, since the opening 128 that communicates with the groove portion 120 and has a region to cover the groove portion 120 wider than the groove portion 120 is formed, the organic film 131 that is filled into the groove portion 120 may be removed from the groove portion 120, in the process of forming the opening 128.

As a result, a particle can be prevented from being generated and manufacturing efficient of the semiconductor device 1 can be improved.

Further, in this embodiment, when the positional relationship between the groove portion 120 formed in the insulating layer 12 and the position aligning opening 142 of the resist film 14 is detected. In the case where the positional relationship between the groove portion 120 and the position aligning opening 142 does not follow the predetermined positional relationship, the resist film 14 is removed and a new resist film 14 is formed. Based on the deviation amount between the groove portion 120 and the position aligning opening 142, the positions of the interconnect opening 141 and the position aligning opening 142 that are formed in the resist film 14 are adjusted.

In this arrangement, it is possible to securely prevent the deviation between the via hole 126 and the interconnect trench 127 (that is, the positional deviation between the via V and the upper interconnect M2) being generated.

Further, in this embodiment, the resist film 13 is configured to include a low-temperature $SiO_2$ film 132 (ashing-resistant film). When the resist film 13 includes the low-temperature $SiO_2$ film 132, the organic film 131 or the insulating layer 12 can be prevented from being subjected to ashing, when the groove portion 120 and the position aligning opening 142 does not follow the predetermined positional relationship, and the resist film 14 is removed by the asking.

Further, the width of the groove portion 120 along the scanning direction of the light is not more than 5 μm. If the width is set to the above dimension, when the light is scanned, a waveform of the light that is reflected or diffracted in the groove portion 120 becomes a waveform that has one peak, as shown in FIG. 4.

That is, since the light that is applied to the groove portion 120 is reflected or diffracted in the sidewall portion of the groove portion 120, when the width of the groove portion 120 is large, a waveform having two peaks or a broad waveform may be obtained from one groove portion 120.

Meanwhile, if the width of the groove portion 120 along the scanning direction of the light is set to be not more than 5 μm, it is possible to detect light whose waveform has a relatively sharp peak. When the positional relationship between the groove portion 120 and the position aligning opening 142 is detected, the position of the groove portion 120 can be simply grasped.

Further, if the width of the groove portion 120 along the scanning direction of the light is set to be not more than 0.2 μm, the width of the groove portion 120 may be secured, and the groove portion 120 may be easily formed.

Further, in this embodiment, the width of the region that is formed along the light scanning direction of the position aligning opening 142 and covers the groove portion 120 is set to be not less than 7 μm and not more than 20 μm.

If the width of the region that covers the groove portion 120 of the position aligning opening 142 is set to be not less than 7 μm, it is possible to detect light of a waveform having a relatively sharp peak from each of a pair of sidewalls that constitute the position aligning opening 142 and is orthogonal to the light scanning direction. As a result, it is possible to accurately grasp the position of the position aligning opening 142.

Further, when the width of the region that covers the groove portion 120 of the position aligning opening 142 is set to be not more than 20 μm, it may be possible to prevent an area of the position aligning opening 142 from being increased.

Further, a distance between the sidewall of the position aligning opening 142 in the light scanning direction and the sidewall of the groove portion 120 in the light scanning direction is set to be not less than 3 μm.

By doing so, it is possible to securely and separately detect each of the peak of the light from the position aligning opening 142 and the peak of the light from the groove portion 120.

Further, in this embodiment, when the semiconductor substrate is seen in plan view from the side of a substrate surface, the position aligning opening 142 is formed in a rectangular frame shape, and the groove portions 120 are four slits that are covered by the individual sides of the position aligning opening 142.

When the groove portion 120 and the position aligning opening 142 are formed in the above shapes, each deviation between the groove portion 120 and the position aligning opening 142 in two direction may be detected using the position aligning opening 142 and the four groove portions 120. That is, the light is scanned in a direction that is orthogonal to a pair of sides facing to each other of the position aligning opening 142, and the deviation between the position aligning opening 142 and the groove portion 120 in an X direction shown in FIG. 4.

Further, the light is scanned in a direction that is orthogonal to another pair of sides facing each other along the position aligning opening 142, and the deviation between the position aligning opening 142 and the groove portion 120 in a Y direction shown in FIG. 4.

Further, the present invention is not limited to the above-described embodiment, but various modifications and changes that are made in a range of achieving the object of the present invention are included in the range of the present invention.

For example, in this embodiment, the light reflected by the sidewall 142A that is located inside the rectangular frame among the sidewalls constituting the position aligning opening 142 is detected and the deviation between the position aligning opening 142 and the groove portion 120 is detected, but the present invention is not limited thereto. The light reflected by the sidewall 142B (refer to FIG. 4) that is located outside the rectangular frame among the sidewalls constituting the position aligning opening 142 may be detected and the deviation between the position aligning opening 142 and the groove portion 120 may be detected.

Further, the light reflected by the sidewalls 142A and 142B that are located inside and outside the rectangular frame among the sidewalls constituting the position aligning opening 142 may be detected and the deviation between the position aligning opening 142 and the groove portion 120 may be detected.

By this configuration, it is possible to accurately detect the deviation between the position aligning opening 142 and the groove portion 120.

In the above-described embodiment, when the semiconductor substrate is seen in plan view, the position aligning opening 142 is formed in a rectangular frame shape, and the groove portions 120 are four slits that are covered by the individual sides of the position aligning opening 142. However, the present invention is not limited thereto.

Further, in the above-described embodiment, light around a visible light region, for example, light having a wavelength of not less than 400 nm and not more than 700 nm is used when the groove portion 120 and the position aligning opening 142 are detected, but the present invention is not limited thereto. For example, the detection may be performed using infrared light.

Further, in the above-described embodiment, when the resist film 14 is exposed again, based on the deviation amount between the position aligning opening 142 and the groove portion 120, the positional relationship between the mask of the exposure device and the resist film 14 is adjusted, but the present invention is not limited thereto. When reproducibility does not exist in the deviation amount, the position of the mask of the exposure device and the position of the resist film 14 may not be adjusted based on the deviation amount.

Further, in the above-described embodiment, the width of the side that covers each groove portion 120 of the position aligning opening 142 is larger than the width of the groove portion 120, but the present invention is not limited thereto. The width of the side that covers each groove portion 120 of the position aligning opening 142 may be equal to the width of the groove portion 120.

It is apparent that the present invention is not limited to the above embodiment, and may be modified and changed without departing from the scope and spirit of the invention.

What is claimed is:

1. A semiconductor device comprising:
    a semiconductor substrate; and
    an insulating layer that is provided on the semiconductor substrate,
    wherein,
    in an internal circuit formation region of the insulating layer, a via hole and an interconnect trench, that is formed on the via hole and communicates with the via hole, are provided,
    in the via hole and the interconnect trench, a conductor is provided so as to integrally bury the via hole and said interconnect trench,
    in a dicing region of the insulating layer, a groove portion and an opening that communicates with the groove portion, and is formed to cover the groove portion when the semiconductor substrate is seen in plan view, are formed, and
    in the groove portion and the opening, a conductor is provided so as to integrally fill the groove portion and the opening.

2. The semiconductor device according to claim 1, wherein when the semiconductor substrate is seen in plan view, a region of the opening is formed in a rectangular frame shape, and
    the groove portions are formed along individual sides of the region of the opening.

3. The semiconductor device according to claim 2, wherein the region of the opening comprises a region of a position aligning opening.

4. The semiconductor device according to claim 2, wherein the groove portions comprise four slits that are covered by individual sides of the region of the opening.

5. A semiconductor device comprising:
- a semiconductor substrate; and
- an insulating layer that is provided on the semiconductor substrate, wherein,
- in an internal circuit formation region of the insulating layer, a via hole and an interconnect trench, that is formed on the via hole and communicates with the via hole, are provided,
- in the via hole and the interconnect trench, a conductor is provided so as to integrally bury the via hole and said interconnect trench,
- in a dicing region of the insulating layer, a groove portion and an opening that communicates with the groove portion, and is formed to cover the groove portion when the semiconductor substrate is seen in plan view, are formed, and
- in the groove portion and the opening, a conductor is provided so as to integrally fill the groove portion and the opening, and
- a region of the opening comprises a region of a position aligning opening.

6. The semiconductor device according to claim 5, wherein
when the semiconductor substrate is seen in plan view, the region of the position aligning opening is formed in a rectangular frame shape, and
the groove portions are formed along individual sides of the region of the position aligning opening.

7. The semiconductor device according to claim 6, wherein
the groove portions comprise four slits that are covered by individual sides of the region of the position aligning opening.

* * * * *